United States Patent [19]

Barnett

[11] Patent Number: 4,816,133

[45] Date of Patent: Mar. 28, 1989

[54] APPARATUS FOR PREPARING THIN FILM OPTICAL COATINGS ON SUBSTRATES

[75] Inventor: Gary J. Barnett, San Pedro, Calif.

[73] Assignee: Northrop Corporation, Hawthorne, Calif.

[21] Appl. No.: 50,600

[22] Filed: May 14, 1987

[51] Int. Cl.⁴ .................... C23C 14/00; B05C 13/02
[52] U.S. Cl. .................................. 204/298; 118/500; 118/730
[58] Field of Search ............... 204/297 R, 298, 192.11; 118/730, 500

[56] References Cited

U.S. PATENT DOCUMENTS

| | | | |
|---|---|---|---|
| 3,667,424 | 6/1972 | Cornelius et al. ............... | 118/730 X |
| 3,828,727 | 8/1974 | Bauerle ................................ | 118/500 |
| 3,853,740 | 12/1974 | Kunz ................................. | 204/192.11 |
| 3,858,547 | 1/1975 | Bergfelt ............................ | 118/730 |
| 3,889,632 | 6/1975 | Brunner et al. ...................... | 118/730 |
| 4,034,704 | 7/1977 | Wössner et al. ..................... | 118/730 |
| 4,222,345 | 9/1980 | Bergfelt et al. ................. | 118/730 X |
| 4,248,687 | 2/1981 | Fan ................................... | 204/192.11 |
| 4,485,759 | 12/1984 | Brandolf .......................... | 118/500 X |
| 4,508,056 | 4/1985 | Bruel et al. ....................... | 118/500 X |
| 4,609,450 | 9/1986 | Seimiya et al. ................... | 204/271 X |

Primary Examiner—Donald R. Valentine
Attorney, Agent, or Firm—Terry J. Anderson; Robert B. Block

[57] ABSTRACT

A system for coating recipient surfaces of substrates with thin optical film by the deposition of coating material. The system comprises a vacuum chamber, a target within the chamber for providing a sputtered flux and an ion beam gun adapted to direct ion emissions within the chamber onto the target to sputter the flux which is then moved in a path of travel to the recipient surfaces of the substrates for constituting the coating material. The system also comprises a cylindrical support means within the chamber to position the substrates with their recipient surfaces located in a primary plane intersecting the path of travel of the coating material and drive means to move the cylindrical support means and substrates with their recipient surfaces within the primary plane while coating material is being deposited upon the recipient surfaces. Adjustment means are also provided to vary the position of the recipient surfaces radially, axially and angularly.

17 Claims, 5 Drawing Sheets

APPARATUS FOR PREPARING THIN FILM OPTICAL COATINGS ON SUBSTRATES

BACKGROUND OF THE INVENTION

The present invention relates to adjustable motion imparting apparatus and, more particularly, to a system for depositing thin film optical coatings on substrates wherein three-way adjustable motion is provided to the substrates.

Description of the Background Art

It is a common practice to prepare thin film optical coatings on substrates in a vacuum chamber through the process of ion beam sputtering. It is also common during such process to provide motion to the substrates by dual motion planetary drives. Such drives, however, have never allowed for the adjustability of the substrates within the chamber. Because of the non-adjustable nature of known devices, unacceptably irregular coatings can often result. This is partially due to the inability to adjust or reposition the substrates and their supporting motion-imparting mechanisms within the chamber to preferred locations with respect to the coating material as it moves in its path of travel to the substrate.

Analyses of the coatings deposited by known devices were conducted through the use of a spectrophotometer to determine the optical physical characteristics of the coatings throughout their extents. Three-way dimensional plots of the material of the coatings were made which verified and quantified the irregularities of the coatings and thereby confirmed the inadequacies of the known devices. These analyses also served as a basis for determining the particular preferred coating-receiving locations within the chamber for both particular substrates and materials.

With the realization that proper positioning and movement of substrates within a chamber will yield superior thin film optical coatings, it was then determined that a superior device for producing superior coatings should provide for independent horizontal, vertical and angular positioning for the substrates. In addition, such a superior device should also include dual planet motion; be shuttered; be electrically isolated; have the ability to handle optics of varying size and shape; be retrofitted into existing chambers using existing feed-through ports and tapped hole locations; and be easy to adjust, clean and maintain.

No known device includes these features, and none has the capability to continuously yield high quality, thin film optical coatings as is possible with the apparatus of the present invention. While prior art patents and known commercial devices may disclose or suggest features analogous to some of the the features herein disclosed, all are simply lacking in one regard or another.

As illustrated by a large number of known commercial devices and prior art patents, efforts are continuously being made to design a device for depositing thin film optical coatings on substrates which is more efficient, reliable, convenient, and economical. Nothing in these prior design efforts, however, suggests the present inventive combination of component elements arranged and configured as disclosed and claimed herein. Prior devices simply do not provide the benefits attendant with the present invention.

The present invention achieves its intended purposes, objectives, and advantages over known prior devices through a new, useful and unobvious combination of component elements through the use of a minimum number of functioning parts, at a reasonable cost to manufacture and use and through the utilization of only readily available materials and components. In addition, the present invention may be employed by people with a minimum of training.

These objects and advantages should be construed as merely illustrative of some of the more prominent features and applications of the present invention. Many other beneficial results may be attained by applying the disclosed invention in a different manner or by modifying the invention within the scope of the disclosure. Accordingly, other objects and advantages as well as a fuller understanding of the invention may be had by referring to the summary and detailed description of the preferred embodiment of the invention in addition to the scope of the invention as defined by the claims taken in conjunction with the accompanying drawings.

SUMMARY OF THE INVENTION

The present invention is defined by the appended claims with a specific preferred embodiment shown in the attached drawings. For the purposes of summarizing the invention, the invention may be incorporated into apparatus for imparting an epicyclic-type motion to a member having a planar surface. The apparatus comprises primary support means to position the member with its planar surface located within a primary plane of movement; primary drive means to rotate the primary support means about a primary axis; secondary support means to position the primary support means and the primary drive means at a position spaced from a secondary axis parallel with, but offset from, the primary axis; secondary drive means to rotate the secondary support means about the secondary axis; and adjustment means to move the position of the primary support means and thereby reposition the member and its planar surface. The adjustment means includes means to shift the primary support means, the primary drive means, the secondary support means and the secondary drive means axially with respect to the primary and secondary axes. The adjustment means includes means to shift the primary support means, the primary drive means, the secondary support means and the secondary drive means radially with respect to the primary and secondary axes. The adjustment means includes means to shift the primary support means, the primary drive means, the secondary support means and the secondary drive means angularly with respect to the primary plane of movement and the primary and secondary axes. The adjustment means includes means to shift the primary support means, the primary drive means, the secondary support means and the secondary drive means axially, radially and angularly with respect to the primary and secondary axes.

The present invention may also be incorporated into an assembly for moving a planar recipient surface of a substrate in a planar path of movement and through the path of travel of coating material. The assembly comprises plate means to support the substrate with its recipient surface in an original plane to intersect the path of travel of the coating material; movable drive gear means coupled with the plate means and substrate for rotation about a first axis of rotation; a spider hub assembly having arms to support the plate means and the movable drive gear means; a main body hub having a central shaft rotatable about its axis and coupled at one end to the spider hub assembly and coupled at its other end to a member for imparting rotary motion thereto, the main body hub also having a stationary gear in meshing engagement with the movable drive gear means whereby rotation of the central shaft will rotate the spider hub assembly about a second axis of rotation parallel with, but offset from, the first axis of rotation and impart an epicyclic motion to the movable drive gear means whereby the recipient surface of the substrate will move in an epicyclic-type motion; and adjustment means to vary the position of the plate means whereby a supported substrate with its recipient surface will be repositioned with respect to its original plane.

The assembly further includes means to position the plate means and the movable drive gear means at predetermined locations along the arms of the spider hub assembly. The adjustment means may axially reposition the recipient surface of the substrate with respect to the first and second axes, shortening or lengthening the path of travel of the coating material. The adjustment means may radially reposition the recipient surface of the substrate with respect to the first and second axes, laterally with respect to the path of travel of the coating material. The adjustment means may angularly reposition the recipient surface of the substrate with respect to the first and second axes, intersecting the original plane. The plate means, the movable drive gear means, the spider hub assembly and the body hub may be axially, radially and angularly repositioned with respect to the first and second axes and the original plane. The adjustment means includes a support assembly coupled at one end to the main body hub with intermediate parts adjustably coupled with respect to each other for axially repositioning the recipient surface of the substrate with respect to the first and second axes. The assembly further including fixed horizontal rods slidably supporting the other end of the support assembly for radially repositioning the recipient surface of the substrate with respect to the first and second axes. The adjustment means includes additional intermediate parts adjustably coupled with respect to each other for angularly repositioning the recipient surface of the substrate into a second plane which intersects the original plane.

Lastly, the present invention may also be incorporated into a system for coating recipient surfaces of substrates with thin optical film by the deposition of coating material. The system comprises a vacuum chamber; a target within the chamber having a surface of sputtered flux; an ion beam gun adapted to direct ion emissions within the chamber onto the target to sputter the flux which is then moved in a path of travel to the recipient surfaces of the substrates for constituting the coating material; cylindrical support means within the chamber to position the substrates with their recipient surfaces located in a primary plane intersecting the path of travel of the coating material; drive means to move the cylindrical support means and substrates with their recipient surfaces within the primary plane while coating material is being deposited upon the recipient surfaces; and adjustment means to vary the position of the recipient surfaces with respect to the primary plane. The adjustment means varies the position of the recipient surfaces by shifting them within the primary plane and laterally with respect to the path of travel of the coating material. The adjustment means varies the position of the recipient surfaces by moving them into an alternate plane parallel with respect to the primary plane thereby lengthening or shortening the path of travel of the coating material. The adjustment means varies the position of the recipient surfaces by moving them into an alternate plane intersecting the primary plane. The system further includes shutter means and shutter drive means to selectively locate the shutter means into or out of the path of travel of the coating material to prohibit or allow the deposition of coating material onto the recipient surfaces. The system further includes means to vary the position of the shutter means concurrently and consistently with the varying of the position of the recipient surfaces. The system further includes means to electrically isolate the support means and their substrates from the housing. The drive means to move the cylindrical support means and shutter drive means include ferrofluidic couplings and ceramic universal joints.

The foregoing has outlined rather broadly the more pertinent and important features of the present invention in order that the detailed description of the invention that follows may be better understood whereby the present contribution to the art may be fully appreciated. Additional features of the invention will be described hereinafter which form the subject of the claims of the present invention. It should be appreciated by those skilled in the art that the conception and the specific embodiment disclosed herein may be readily utilized as a basis for modifying or designing other apparatus for carrying out the same purposes of the present invention. It should also be realized by those skilled in the art that such equivalent apparatus do not depart from the spirit and scope of the invention as set forth in the appended claims.

BRIEF DESCRIPTION OF THE DRAWINGS

For a more complete understanding of the nature, objects and advantages of the present invention, reference should be had to the following detailed description taken in conjunction with the accompanying drawings in which.

Similar reference numerals refer to similar parts throughout the several figures.

DETAILED DESCRIPTION OF THE INVENTION

Figure 1:
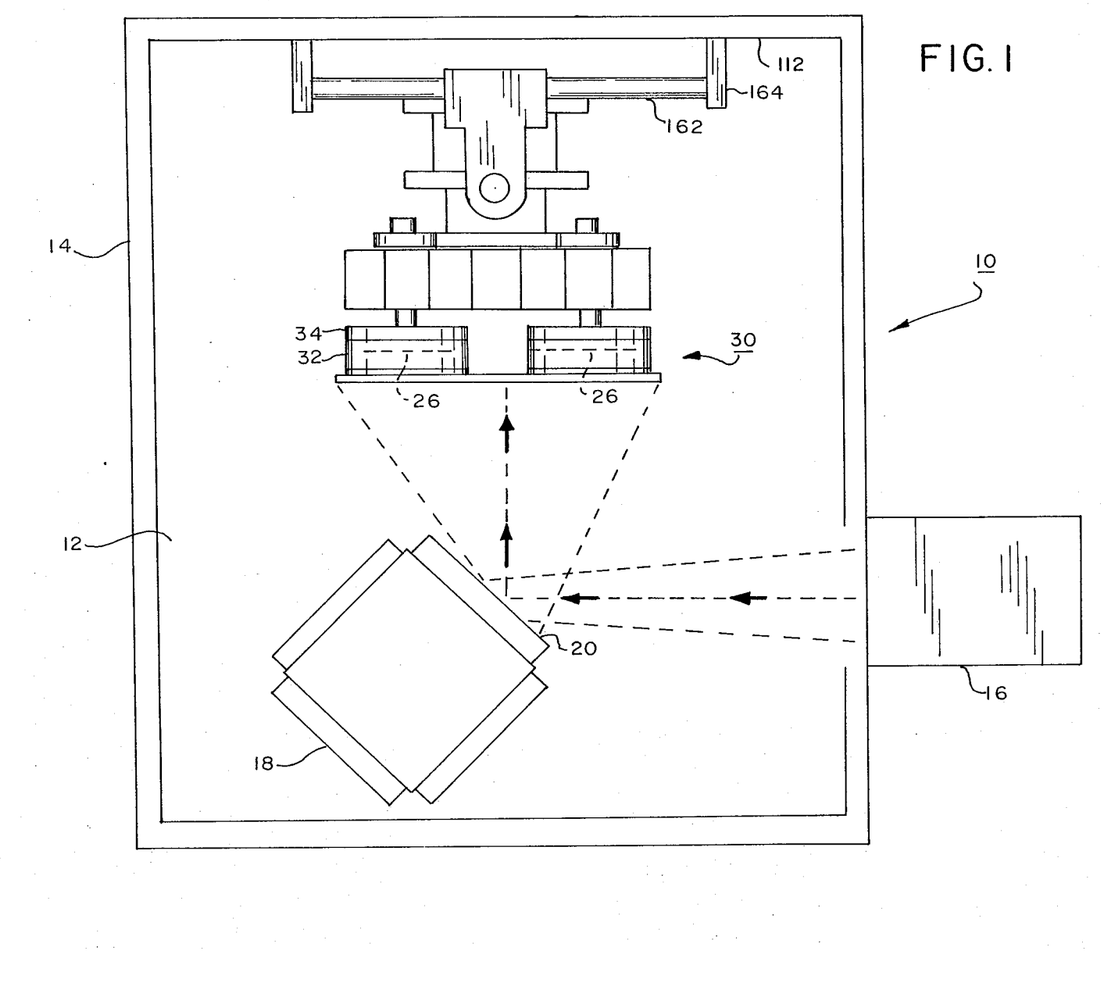
FIG. 1 is an elevational view of apparatus constructed in accordance with the principles of the present invention with parts removed for greater clarity and showing the chamber, the ion beam gun, the target assembly and the drive assembly in relation to each other.

Shown in FIG. 1 is a thin film optical coating system 10 constructed in accordance with the principles of the present invention. The system includes a vacuum chamber 12 formed of walls 14 within which the operating components of the system are positioned and arranged. The system includes an ion beam gun 16 secured to the exterior of the chamber in sealed relationship for directing ion beams into the chamber. As indicated by the arrows in FIG. 1, the ion beams are directed at a target assembly 18 having a plurality of target surfaces 20 one of which is positioned in the path of travel of the ion beams. Any of the target assembly surfaces 20, four in number in the disclosed preferred embodiment, may be positioned to receive the ion beams whereat flux will be sputtered off the target surface 20 and be directed in a path of travel extending to the recipient surface 24 upon the substrate 26 as indicated by the arrows. The target thus constitutes the source of coating material to be deposited on the substrate.

The entire chamber 12 is sealed from the atmosphere and pumped of essentially all gaseous materials so that the ion deposition process may be more efficiently performed. It is preferred to pump all gaseous material from the chamber so that the process is carried out in a vacuum of between about $10^{-4}$ to about $10^{-6}$ Tor.

It has also been found that the ion material depositing process may be rendered more efficient and yield superiorly coated substrate surfaces by positioning the recipient surfaces 24 in a particular position and orientation with respect to the path of travel of the coating material and by moving the recipient surfaces in a particular plane of movement.

With regard to the movement of the recipient surfaces, a drive assembly 28 of interrelated motion-imparting mechanisms support and move the substrates with their recipient surfaces within their plane of movement at locations which intersect the path of travel of the coating material. The substrates 26 themselves are supported in plate subassemblies 30, four in number as can be understood by viewing FIG. 4, each consisting of a cylindrical support planet 32 and a cylindrical mounting plate 34. Bolts 36 releasably couple each substrate planet in alignment with its associated mounting plate for rotation about a common first axis 38. Each substrate planet 32 includes two cylindrical holes 40 extending therethrough with axes parallel with the first axis of its plate subassembly. The holes are sized to receive a substrate to be coated. A cylindrical ledge 42 extends inwardly at the bottom of each hole to retain a substrate therein and expose its lower surface. Note FIG. 5. The lower face at the substrate facing the target constitutes the recipient surface to be coated with flux from the sputtered target. Loading of uncoated substrates and unloading of coated substrates is effected by unthreading bolts 36 from the mounting plates 34.

Figure 4:
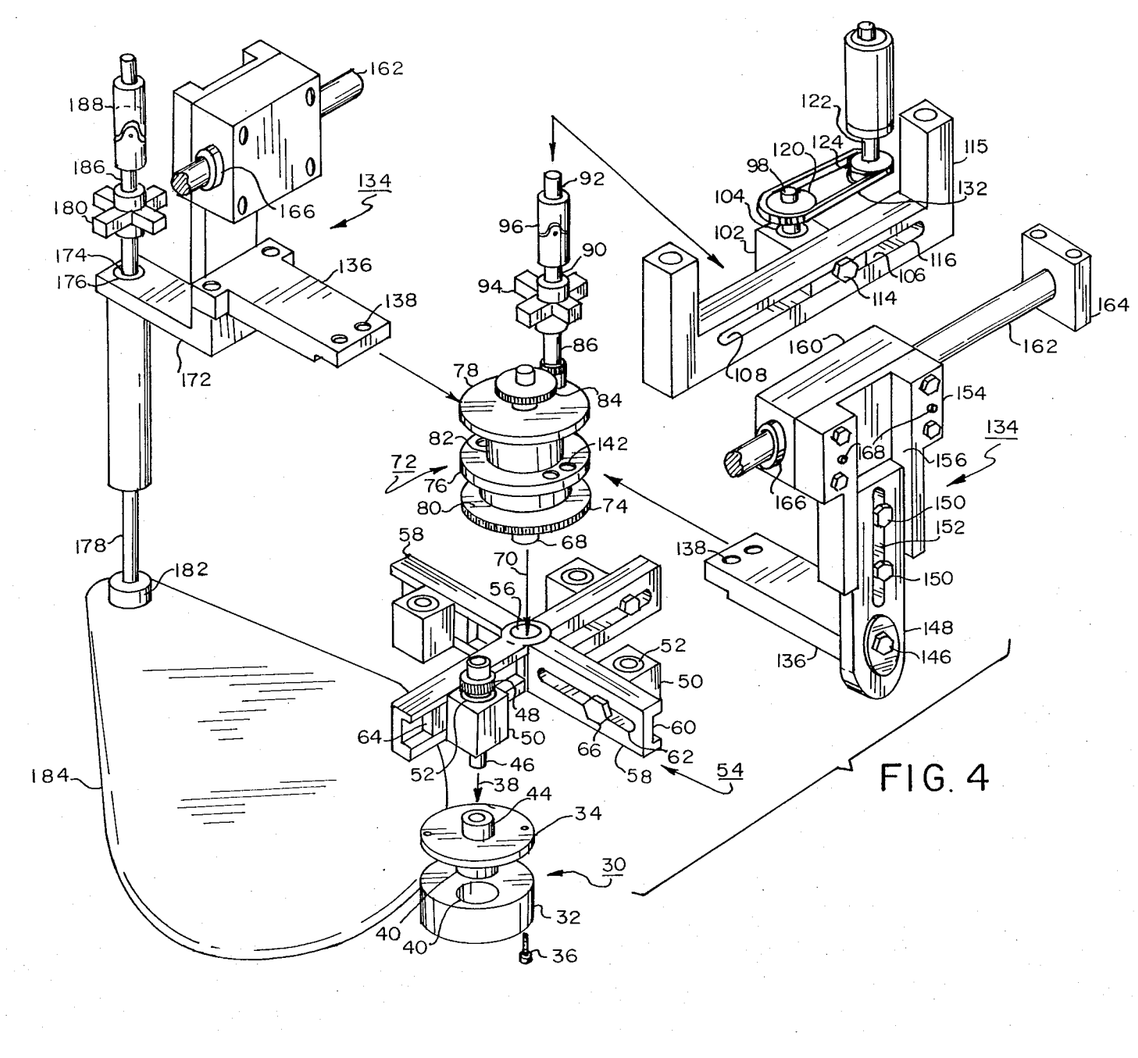
FIG. 4 is an exploded perspective view of the drive assembly of FIGS. 1, 2 and 3 with portions removed for clarity.
Figure 5:
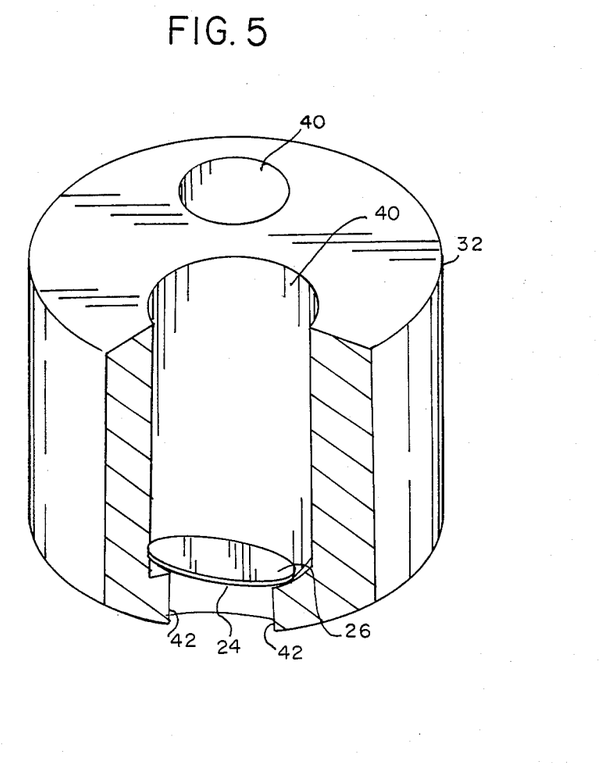
FIG. 5 is an enlarged perspective view of a substrate with its recipient surface operatively received within the drive assembly and in position to receive the coating material.

An upwardly extending collar 44 extends from the upper surface of each mounting plate receives the lower end of a vertical planet shaft 46. Releasable securement is effected as by set screws. The upper end of each planet shaft is secured to a movable drive gear 48. Releasable securement is again effected as by set screws. Each planet shaft is rotatably received in the bore of a repositionable planet shaft hub 50 through bearing sleeves 52 whereby rotation of each drive gear 48 will rotate its associated planet shaft 46, mounting plate 34, substrate planet 52 and substrate 26 about their common first axis of rotation 38.

Support and motion is provided to the planet shaft hubs 50 by a spider hub assembly 54 formed of a central collar 56 and a plurality of radially extending arms 58. Each arm is formed with a channel 60 and slot 62. Within each channel is an apertured slide block 64 part of hub 50. A bolt 66 extends through each slot and slide block and is threaded into its associated planet shaft hub 50 whereby their location on the arms may be varied by loosening and tightening the bolts 66. While four arms are shown on the spider hub assembly 54, it should be understood that any number of arms and planet shaft hubs may be utilized as a function of the size of the plate assemblies and the substrates to be coated. For example, if the substrates are too large to be accommodated on the four arms of the shown spider hub assembly, then a three arm arrangement would be utilized to provide additional space for accommodating the larger substrates and plate assemblies.

The collar 56 of the spider hub assembly receives the lower end of a hub shaft 68 which is rotatable about a second axis 70 parallel with, but offset from, the first axis 38. Set screws allow for their releasable coupling. Located about the hub shaft is the main body hub 72 having a central bore in which the hub shaft 68 is received for rotation while the main body hub 72 remains non-rotatable. The main body hub 72 is formed with a large stationary gear 74 at its lower end supported by a member including a pair of flanges 76 and 78 thereabove with spacers 80 and 82 therebetween. A driven hub gear 84 is secured to the upper end of the hub shaft 68 for rotation therewith. Rotation of the driven hub gear 84 thus rotates the hub shaft 68, spider hub assembly 54, planet shaft hubs 50, drive gears 48, planet shafts 46, plate assemblies 30 and substrates 26 about the second axis 38.

A dual, compound or planetary motion is imparted to the drive gears 48, planet shafts 46, plate assemblies 30 and substrates 26 by the relationship of the drive gears 48 to the stationary gear 74. More specifically, the teeth of the drive gears 48 are intermeshed with the teeth of the stationary gear 74 whereby rotation of the drive gears 48 about the second axis 70 of the stationary gear 74 will also rotate the drive gears 48 about their own first axes 38. This will impart an epicyclic movement to the drive gears 48 and, concurrently, an epicyclic-type movement to the plate assemblies 30 and their supported substrates 26.

Figure 2:
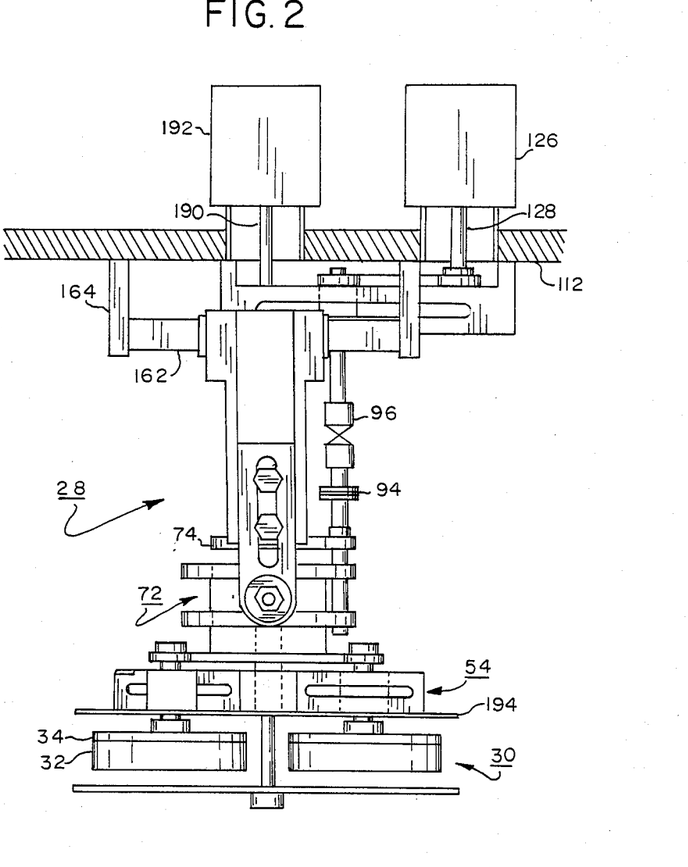
FIG. 2 is an enlarged side elevational view of the drive assembly of FIG. 1.

An input gear 86 meshes with the driven hub gear 84 at the upper end of the hub shaft 68 and imparts rotational motion thereto. The input gear shaft 86 is journaled in the upper face of upper flange 78 and is driven through a mechanical arrangement which includes a lower shaft part 90 and an upper shaft part 92 coupled through a ceramic universal coupling 94 to thereby electrically isolate the drive assembly components therebelow including the substrates 26 from those portions of the drive assembly thereabove. The upper shaft part is received in a universal joint 96 which couples to a driven shaft 98 mounted in an aperture of shaft hub 102 through a bearing sleeve 104. The shaft hub 102 is threaded and includes an apertured slide block 106 located in channel 108 of a fixed support 110 depending from the top wall 112 of the chamber. Tightening and loosening of a bolt 114 extending through the slot 116, the aperture of slide block 106 and threaded into the shaft hub 102 allows for positioning the shaft hub and, consequently, those portions of the drive assembly therebeneath in a direction radially with respect to the first and second axes of rotation 38 and 70. Additional components are also required to effect this axial motion and will be described hereinafter. The driven shaft 98 and gear 120 receive their motive power from a drive shaft 122 and gear 124 powered by a motor 126 through a Ferrofluidic coupling 128. Ferrofluidic is a trademark of the Ferrofluidic Corporation of Nashua, N.H. This particular type of coupling is utilized because of its ability to function well in a vacuum environment in the range in which the present system is intended to operate. It effects a direct coupling between the motor 126 and the shaft 122 using magnets and magnetic fluid to create a vacuum seal by situating the fluids between the poles of the magnets thereby creating a virtually leak-free, leak-tight seal.

A chain 132 couples the drive gear 124 and driven gear 120. Different lengths chains would be utilized when a particular coating arrangement requires a different positioning of the motion-imparting mechanisms within the chamber. The universal joint 96 and ceramic coupling 94 also function to allow the proper positioning of the motion-imparting mechanisms of the drive assembly and the substrate for a particular coating operation. In addition, the stationary gear 74 and drive gears 48 may be varied to provide particular speed and position relationships as may be required for particular coating parameters.

Figure 3:
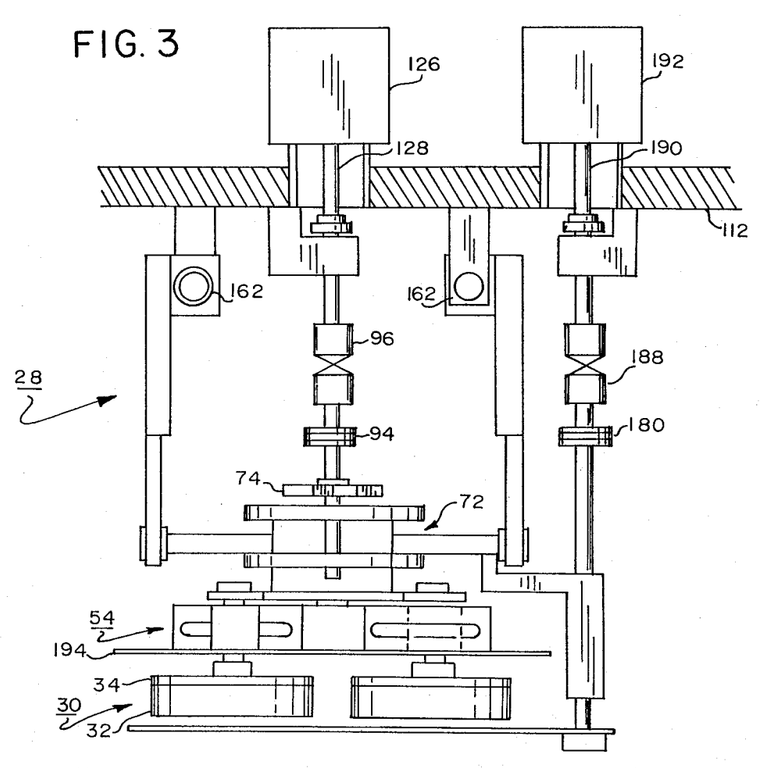
FIG. 3 is an enlarged front elevational view of the drive assembly of FIG. 1 taken generally from the line 3—3 of FIG. 1.

Adjustment assemblies 134 are provided on opposite sides of the main body hub 72 to provide for the primary adjustments of the motion-imparting mechanisms of the drive assembly and substrates in the horizontal, vertical and angular orientations. The adjustment assemblies each include a horizontal support arm 136 having apertures 138 on their radially interior ends through which bolts may be positioned for threaded securement with threaded apertures 142 in the central flange 76 of the main body hub 72. As a result, the support arms 136 and central flange 76 will move together in the orienting of substrates radially, axially and angularly within the chamber and with respect to the path of travel of the coating material to the substrate.

The radially exterior ends of the support arms each have a horizontally disposed threaded aperture to receive bolts 146 extending through apertures at the lower ends of vertical height adjustment arms 148. Tightening and loosening of these bolts 146 allows the support arms 136 and central flange 76 of the main body hub 72 to be angularly reoriented with respect to the original orientation whereby the plane of movement of the substrates will intersect its original or previous plane.

Vertically spaced bolts 150 extend through a vertically oriented slot 152 in each vertical height adjustment arm 148 and are received in threaded apertures in vertical height arm supports 154. The vertical height arm supports 154 are formed with channels 156 in which the vertical height adjustment arms 148 may be positioned for sliding. Loosening and tightening the bolts 150 allows for the raising and lowering of the support arms 148, the main body hub 72 and other motion-imparting mechanisms of the system including the substrates 26. The upper end of each height arm support 154 is bolted to an apertured slide block 160 for receiving fixedly positioned horizontal shafts 162. The opposite ends of the horizontal shafts are mounted in shaft supports 164 which are fixedly secured to the top wall 112 of the chamber 12. Insulating bearing sleeves 166, as of teflon or the like, are provided in the apertures of the slide blocks 160 for receiving the horizontal shafts 162 to facilitate reciprocation of the slide blocks and to electrically isolate the supported motion-imparting mechanisms of the drive assembly including the substrates 26 from the horizontal shafts 162, shaft supports 164, and the walls of the chamber 12.

One of the two adjustment assemblies 134 is provided with a shutter drive support housing 172 extending downwardly and radially outwardly from beneath one of the support arms 136. The shutter drive support housing 172 includes an extended bearing aperture 174 with a bearing sleeve 176 through which a shutter shaft 178 passes. The upper end of the shutter shaft is received in a ceramic universal coupling 180. This coupling allows for the proper orientation and alignment between the shaft it couples and also electrically isolates the shutter and adjacent components from the drive mechanisms thereabove. The lower end of the shutter shaft 178 is received in a collar 182 at one end of the shutter 184. Set screws allow for the releasable coupling between the shutter shaft 178 and its collar 182 and, consequently, for the adjustment of the position of the shutter 184 with respect to its drive mechanisms.

Above the ceramic universal coupling 180 is an additional shaft 186 and universal joint 188, Ferrofluidic coupling 190 and drive motor 192 including its supports and chain arrangement similar in structure and function to those employed to drive the motion-imparting mechanisms. The axial repositioning of the motion-imparting mechanisms is effected by substituting longer or shorter shaft parts immediately above the universal coupling. A simple mechanical coupler attaches such variable shaft part with the shaft part thereabove.

The shutter 184 is a tear drop shaped plate. Motion is imparted to the shutter by its motor 192 and its Ferrofluidic coupling 190 to rotate it to a position parallel with, and immediately beneath, the recipient surfaces 24 of the substrates 26 to prohibit the deposition of coating material thereon and to rotate it to an alternate angular position away from the recipient surfaces 24 of the substrates 26 to thereby allow the deposition of coating material onto the recipient surfaces 24 of the substrates 26. Located parallel with the shutter, but on the opposite side of the plate assembly 30 and mounted therewith, is a deposition shield 194. The deposition shield precludes coating material from movement thereabove when the shutter is moved away from the substrates whenever coating material is being deposited onthe substrates. The deposition shield thus assists in maintaining the apparatus clean.

In operation and use, an operator would first determine the size of the substrate 26 to be coated and the coating characteristics desired and then select the proper substrates and plate subassemblies 30. Thereafter, testing of the apparatus would be performed to determine the substrate positioning and movement required to attain the desired substrate coating. Test plates would then be positioned within the chamber at different heights and angular orientations to determine the optimum movement and positioning of the recipient surfaces within the chamber and with respect to the path of travel of the coating material. The test plates would be removed and analyzed and, as a result thereof, the motion imparting mechanisms of the drive assembly along with the shutter and their drive mechanisms would be positioned in the preferred orientation as determined by the tests. Such positioning would be done by first adjusting the radial orientation of the motion imparting mechanisms and shutter with respect to the first and second axis. This would be effected by loosening the set screws 168 to adjust the slide blocks 160 along the horizontal shafts 162. Tightening the set screws 168 would fix the radial position. Next, the axial orientation of the motion imparting mechanisms and shutter with respect to the first and second axes would be effected. This would be effected by loosening the bolts 150 to raise or lower the vertical height adjustment arms 148 with respect to the height arm supports 154. Thereafter, the bolts 150 would be tightened to fix the axial position. The third orientation to set is the varying of the angular orientation of the of the motion imparting mechanisms and shutter. This would be effected by loosening the bolts 146 and rotating the support arms 136 with respect to the height adjustment arms 148. Tightening the bolts 146 would fix the angular position. Lastly, the driving mechanisms above the universal joints 96 and 188 would be adjusted with properly sized chains being selected and utilized along with shaft parts of proper lengths selected and inserted. Proper relationships of the motion imparting mechanisms is important for efficient operation, particularly in a vacuum environment where the use of lubricants is not permitted. A properly sized stationary gear 74 and drive gears 48 would also be selected and utilized as part of the set up procedure, all as a function of the substrates to be coated and the coating characteristics desired. The last set up adjustment is the electrical biasing of the electrically isolated parts of the drive assembly beneath the ceramic universal couplings 96 and 180 and the bearing sleeves 166. A proper electrical biasing precludes improper deposition of coating material on the operating parts within the chamber other than the substrates.

With the mechanisms of the system properly adjusted as a function of the recipient surfaces of the substrates to be coated, the motors 126 and 192 would be activated to drive the various motion-imparting mechanisms of the drive assembly with the driven gears 48 moving in an epicyclic motion and with the plate subassemblies 30 and substrates 26 moving in an epicyclic type motion with the recipient surfaces 24 of the subassemblies 26 moving in a plane most suitable for the coating characteristics desired. The shutter plate could then be sequenced between positions by energizing the Ferrofluidic coupling 190 to prohibit or allow the coating as intended.

The present disclosure includes that information contained in the appended claims as well as that in the foregoing description. Although the invention has been described in its preferred form or embodiment with a certain degree of particularity, it is understood that the present disclosure of the preferred form has been made only by way of example and that numerous changes in the details of construction, fabrication and use, including the combination and arrangement of parts may be resorted to without departing from the spirit and scope of the invention.

What is claimed is:

1. An assembly for moving a planar recipient surface of a substrate in a planar path of movement and through the path of travel of coating material comprising:
   plate means to support the substrate with its recipient surface in an original plane to intersect the path of travel of the coating material;
   movable drive gear means coupled with said plate means and substrate for rotation about a first axis of rotation;
   a spider hub assembly having arms to support said plate means and said movable drive gear means;
   a main body hub having a central shaft rotatable about its axis and coupled at one end to said spider hub assembly and coupled at its other end to a member for imparting rotary motion thereto, said main body hub also having a stationary gear in meshing engagement with said movable drive gear means whereby rotation of said central shaft will rotate said spider hub assembly about a second axis of rotation parallel with, but offset from, the first axis of rotation and impart an epicyclic motion to said movable drive gear means whereby the recipient surface of the substrate will move in an epicyclic-type motion; and
   adjustment means to vary the position of said plate means whereby a supported substrate with its recipient surface will be repositioned with respect to its original plane.

2. The assembly as set forth in claim 1 and further including means to position said plate means and said movable drive gear means at predetermined locations along said arms of said spider hub assembly.

3. The assembly as set forth in claim 1 wherein said adjustment means may axially reposition the recipient surface of the substrate with respect to the first and second axes, shortening or lengthening the path of travel of the coating material.

4. The assembly as set forth in claim 1 wherein said adjustment means may radially reposition the recipient surface of the substrate with respect to the first and second axes, laterally with respect to the path of travel of the coating material.

5. The assembly as set forth in claim 1 wherein said adjustment means may angularly reposition the recipient surface of the substrate with respect to the first and second axes, intersecting the original plane.

6. The assembly as set forth in claim 1 wherein said plate means, said movable drive gear means, said spider hub assembly and said body hub may be axially, radially and angularly repositioned with respect to the first and second axes and the original plane.

7. The assembly as set forth in claim 6 wherein said adjustment means includes a support assembly coupled at one end to said main body hub with intermediate parts adjustably coupled with respect to each other for axially repositioning the recipient surface of the substrate with respect to the first and second axes.

8. The assembly as set forth in claim 7 and further including fixed horizontal rods slidably supporting the other end of said support assembly for radially repositioning the recipient surface of the substrate with respect to the first and second axes.

9. The assembly as set forth in claim 8 wherein said adjustment means includes additional intermediate parts adjustably coupled with respect to each other for angularly repositioning the recipient surface of the substrate into a second plane which intersects the original plane.

10. A system for coating recipient surfaces of substrates with thin optical film by the deposition of coating material comprising
    a vacuum chamber; a target within said chamber for providing a sputtered flux;
    an ion beam gun for directing ion emissions within said chamber onto said target to sputter the flux which is then moved in a path of travel to the recipient surfaces of the substrates for constituting the coating material;

plate means to support the substrate with its recipient surface in an original plane to intersect the path of travel of the coating material;

drive means for moving the cylindrical support means including movable drive gear means coupled with said plate means and substrate for rotation about a first axis of rotation;

a spider hub assembly having arms to support said plate means and said movable drive gear means; and a main body hub having a central shaft rotatable about its axis and coupled at one end to said spider hub assembly and coupled at its other end to a member for imparting rotary motion thereto, said main body hub also having a stationary gear in meshing engagement with said movable drive gear means whereby rotation of said central shaft will rotate said spider hub assembly about a second axis of rotation parallel with, but offset from, the first axis of rotation and impart an epicyclic motion to said movable drive gear means whereby the recipient surface of the substrate will move in an epicyclic-type motion; and adjustment means to vary the position of said plate means whereby a supported substrate with its recipient surface will be repositioned with respect to its original plane.

11. The system as set forth in claim 10 wherein said adjustment means varies the position of the recipient surfaces by shifting them within the primary plane and laterally with respect to the path of travel of the coating material.

12. The system as set forth in claim 10 wherein said adjustment means varies the position of the recipient surfaces by moving them into an alternate plane parallel with respect to the primary plane thereby lengthening or shortening the path of travel of the coating material.

13. The system as set forth in claim 10 wherein said adjustment means varies the position of the recipient surfaces by moving them into an alternate plane intersecting the primary plane.

14. The system as set forth in claim 10 further including shutter means and shutter drive means to selectively locate said shutter means into or out of the path of travel of the coating material to prohibit or allow the deposition of coating material onto the recipient surfaces.

15. The system as set forth in claim 14 further including means to vary the position of said shutter means concurrently and consistently with the varying of the position of the recipient surfaces.

16. The system as set forth in claim 14 wherein said drive means to move the cylindrical support means and said shutter drive means include ferrofluidic couplings and universal and ceramic joints.

17. The system as set forth in claim 10 further including means to electrically isolate said support means and their substrates from said housing.

* * * * *